US006756285B1

(12) United States Patent
Moriceau et al.

(10) Patent No.: US 6,756,285 B1
(45) Date of Patent: Jun. 29, 2004

(54) MULTILAYER STRUCTURE WITH CONTROLLED INTERNAL STRESSES AND MAKING SAME

(75) Inventors: Hubert Moriceau, St-Egréve (FR); Olivier Rayssac, Grenoble (FR); Anne-Marie Cartier, Le Genevrey (FR); Bernard Aspar, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/913,006

(22) PCT Filed: Feb. 9, 2000

(86) PCT No.: PCT/FR00/00308

§ 371 (c)(1),
(2), (4) Date: Jan. 9, 2002

(87) PCT Pub. No.: WO00/48238

PCT Pub. Date: Aug. 17, 2000

(30) Foreign Application Priority Data

Feb. 10, 1999 (FR) .............................. 99 01558

(51) Int. Cl.⁷ ............................. H01L 21/02; B32B 5/00
(52) U.S. Cl. ...................... 438/455; 438/457; 438/459; 438/761; 438/766; 428/620; 428/457
(58) Field of Search .................. 438/455, 457, 438/459, 761, 620, 763, 765, 766, 769, 487; 428/620, 457, 469, 698, 699

(56) References Cited

U.S. PATENT DOCUMENTS 5,261,999 A * 11/1993 Pinker et al. ............... 438/459
5,310,451 A * 5/1994 Tejwani et al. ............. 438/459
5,362,667 A * 11/1994 Linn et al. .................. 438/455
5,373,184 A * 12/1994 Moslehi ...................... 257/499
5,728,623 A * 3/1998 Mori .......................... 438/455
5,753,134 A * 5/1998 Biebl ......................... 438/52
5,854,123 A * 12/1998 Sato et al. .................. 438/507
5,909,627 A * 6/1999 Egloff ........................ 438/406
6,143,628 A * 11/2000 Sato et al. .................. 438/455
6,255,731 B1 * 7/2001 Ohmi et al. ................ 257/758

FOREIGN PATENT DOCUMENTS

EP         0410679      * 1/1991
JP         06013593     * 6/1992

* cited by examiner

*Primary Examiner*—Deborah Jones
(74) *Attorney, Agent, or Firm*—Anderson Kill + Olick, P.C.; Eugene Lieberstein; Michael N. Meller (57) ABSTRACT

A multilayer structure with controlled internal stresses comprising, in this order, a first main layer (110a), at least a first constraint adaptation layer (130) in contact with the first main layer, at least a second stress adaptation layer (120) put into contact by adhesion with said first stress adaptation layer, and a second main layer (110b) in contact with the second stress adaptation layer, the first and second stress adaptation layers having contact stresses with the first and second main layers.

Application to the realization of electronic circuits and membrane devices.

17 Claims, 6 Drawing Sheets

MULTILAYER STRUCTURE WITH CONTROLLED INTERNAL STRESSES AND MAKING SAME

TECHNICAL FIELD

The present invention relates to a multilayer structure obtained by adhesion or adherence, in particular molecular adhesion, characterized by controlled internal stresses, and to a method for producing such a structure.

By multilayer structure with controlled stresses, it is understood a structure comprising at least two layers, so-called main layers, having between them tensile or compression stresses. These stresses are determined and controlled depending on the purpose of the structure.

The invention finds applications in the fields of microelectronics, as a substrate or as a stiffener, but also in the fields of micromechanics for manufacturing membrane sensors, for example.

STATE OF THE PRIOR ART

Among the multilayer structure assembled by means of molecular adhesion techniques (wafer bonding), let us mention SOI (silicon on an insulator) structures, as an example. Typically, a SOI multilayer structure includes a thick layer of silicon serving as a support, an insulating layer in silicon oxide and a surface layer of thin silicon, the thickness of which is between a few tens of nanometers to a few tens of micrometers.

The manufacturing of SOI structures generally consists of bringing two silicon wafers into contact by molecular adhesion, one of which at least is covered by a silicon oxide surface layer.

After bringing them into contact, the wafers generally undergo a heat treatment under a controlled atmosphere. The purpose of this heat treatment is to enhance the close contact and therefore the adherence of the wafers.

During the heat treatment, the present materials, in particular silicon in contact with silicon oxide, may impose stresses on each other. These stresses are in particular related to the differences in thermal expansion coefficients, $\Delta l/1$, of the materials in contact. These differences in the expansion coefficients of materials of the surfaces in contact are also the source of stresses when cooling the closely bound structures.

More generally, it is also known that a $SiO_2$ film on a silicon wafer when it is produced at certain temperatures, has the effect of inducing deformation on the wafer upon its cooling. The relative deformation under the effect of heat, noted $\Delta l/1$, is the order of $2.6.10^{-6}/K$ for silicon, and of the order of $5.10^{-7}/K$ for silicon oxide ($SiO_2$), produced by thermal oxidation of silicon.

When the oxide film is formed on one face of the silicon wafer, the deformation due to the stresses may be quantified by measuring the deflection at the center of the wafer. Because of the difference in thermal expansion coefficients, a decrease of temperature generates a compression of the oxide film on the silicon wafer. This compression is expressed by a convexity of the wafer. The convexity is all the more marked because the oxide film is thick and it may cause a change in the surface morphology.

The appended FIGS. 1–4 are for illustrating the stresses generated in $SiO_2$ structures produced by conventional methods through molecular adhesion.

Figure 1:
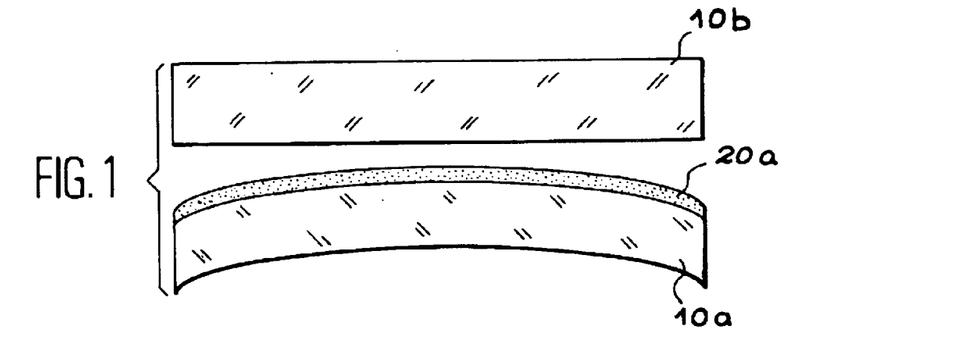
FIG. 1, already described, is a schematic sectional view of first and second main layers before assembly, one of the layers being covered with a surface film in a material capable of generating internal stresses.

FIG. 1 shows a first main layer 10a, or support, as a silicon plate having a thin layer of thermal oxide 20a on its surface.

It is seen that the set formed by the first main silicon layer 10a and the oxide surface layer 20a is bent. The surface of the oxide layer 20a is convex.

Reference number 10b refers to a silicon wafer forming a second main layer the parallel faces of which are planar In the illustrated example, the main layers 10a and 10b initially have thicknesses of the same order of magnitude.

Figure 2:
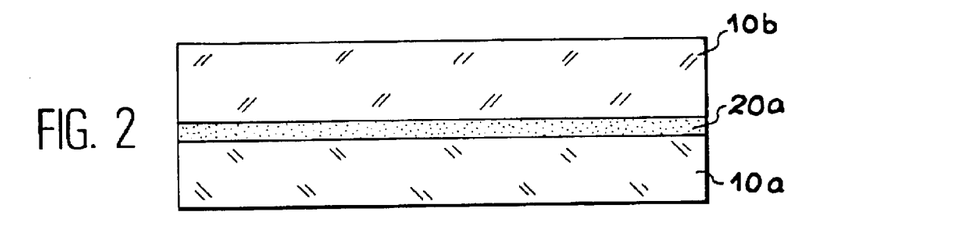
FIG. 2, already described, illustrates a structure comprising the layers of FIG. 1, after assembly.

FIG. 2 shows the structure obtained by assembling main layers 10a and 10b. These layers are connected through the oxide layer 20a. The assembly, as mentioned earlier, comprises the molecular bonding of the second main layer of silicon 10b onto the oxide surface layer 20a. This bonding is reinforced by a heat treatment.

It is seen that the structure obtained after assembly virtually does not have any deformation. Indeed, from the moment that the thicknesses of the main silicon layers are of the same order of magnitude, stresses generated by the oxide layer on each of the main layers tend to compensate each other.

The silicon surface film with a SOI type structure is generally a thin film, the thickness of which is adapted to the requirements of electrical insulation of the components, for example. The stiffness of the structure is provided by the thick silicon layer.

Thus, in order to obtain a typical SOI structure from the structure of FIG. 2, one of the main silicon layers should be thinned. The thinning may be performed by means of one of the thinning techniques known in different methods, BSOI (Bonded Silicon on Insulator), BESOI (Bonded with Etch stop Layer Silicon on Insulator). On this point, reference may be made to document (7), the reference thereof is specified at the end of the present description.

When one of the main silicon layers is thinned, it appears that the generated stresses at the interfaces with the silicon oxide layer are no longer compensated.

Figure 3:
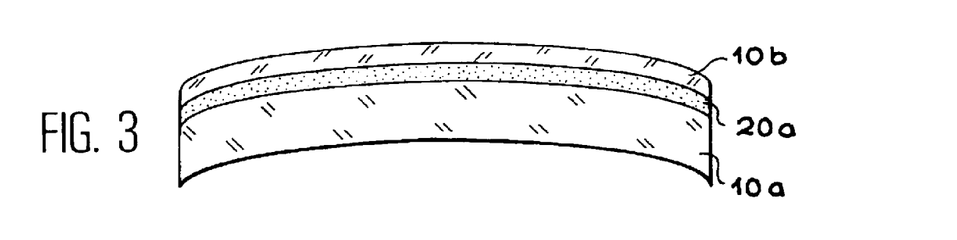
FIGS. 3 and 4, already described, illustrates in a schematic sectional view, the structure of FIG. 2 after thinning of one of the main layers.
Figure 4:
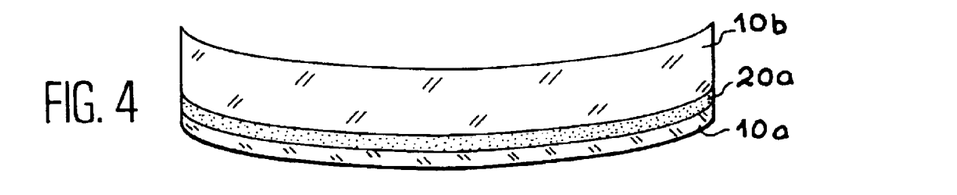

FIGS. 3 and 4 show structures obtained by thinning of the main layers 10b and 10a, respectively. These structures have a deflection and the surface of the thin silicon layer is convex in each of the cases.

It is seen that the thickness of the main layers and also the thickness of the buried silicon oxide layer, i.e., the oxide layer sandwiched between the main layer and the thin surface layer, are part of the parameters which control the deflection of the finally obtained structure.

As an example, for a buried thermal oxide film 20a with a thickness of the order of 1 micrometer, deflection values are obtained which may be larger than 50 $\mu$m when the thin surface film of silicon 10a has a thickness of 25 $\mu$m and when the main silicon layer has a thickness of the order of 500 $\mu$m. When the thickness of the surface film of silicon is increased to more than 50 $\mu$m, the deflection decreases by about 25 $\mu$m. This shows the importance of the thickness of the silicon film as compared with that of the oxide film.

A conceivable step for reducing the deformations of the structure would consist of producing a second oxide film on the free face, called the rear face, of the thick main layer of the structure. This step would actually enable the deformation of the plates to be reduced before their bringing into contact. However, in a certain number of applications, it is necessary to remove the rear oxide film. Now, after thinning, if the oxide film is removed from the rear face, it is seen that deformation is restored and finally a deformation of the SOI structure mainly related to the thickness of the oxide film, is obtained.

On this point, reference may be made to document (1) the reference of which is specified at the end of the description.

Figure 5:
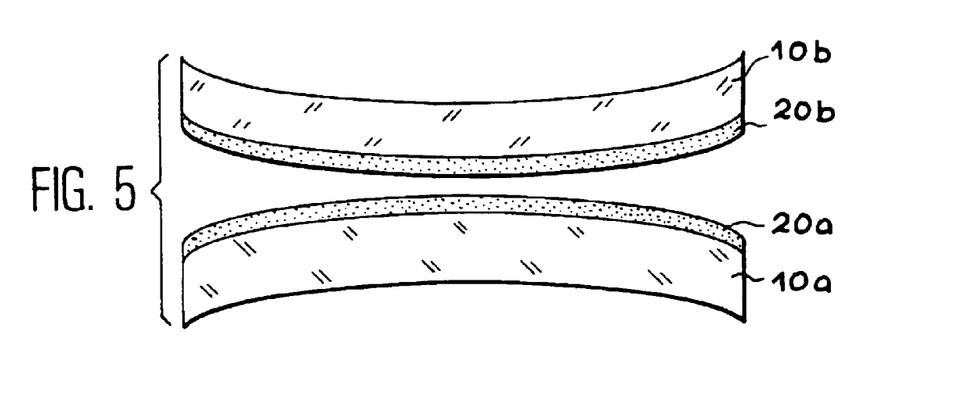
FIG. 5, already described, schematically illustrates a pair of main layers each supporting a surface layer having a tensile stress.

According to another possibility, illustrated by FIG. 5, an attempt may be made to reduce the effect of the stresses by bringing into contact two main silicon layers 10a, 10b each provided with an oxide film 20a, 20b at the surface, the films being of comparable thickness. However, it is seen that a deformation appears for the structure when thinning one of the layers. Further, as shown in FIG. 5, the initial deflection of both main layers increases the difficulty for bringing into contact the surfaces of the oxide surface layers. This may locally generate areas with poor contact and therefore recesses or defects in the final structure.

The deformation phenomenon described above for a structure combining silicon and silicon oxide layers exists for a large number of pairs of materials. However, the generated deformation may vary depending on the materials brought into contact with each other, and notably on the type of stress which occurs, either a tensile or compression stress.

Figure 6:
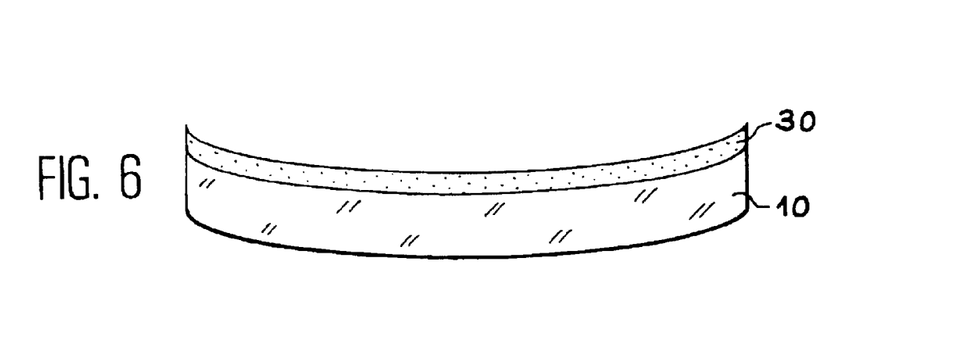
FIG. 6, already described, schematically illustrates a main layer supporting a surface layer having a tensile stress.

As an example, as shown in FIG. 6, when a silicon nitride film 30 is deposited on a silicon wafer 10, this coating may generate, depending on the conditions of its implementation and after cooling, stresses also leading to a deformation.

The stresses between the silicon nitride and the silicon intrinsically originate from the materials but also have a thermal origin in relationship with the different thermal expansion coefficients. As an example, the thermal expansion coefficient of a silicon nitride film obtained by chemical vapor deposition (CVD) is of the order of $4.2.10^{-6}$/K whereas this coefficient is $2.6.10^{-6}$/K for silicon. As deposition of silicon nitride takes place at a high temperature, strong stresses occur during the cooling.

However, it is seen, by comparing for example, FIGS. 6 and 1, that the surface of the silicon nitride layer 30 is concave, unlike the convex surface of the silicon oxide layer 20a.

This difference in curvature expresses the fact that silicon nitride and silicon oxide have contact stresses which are generally opposite (tension-compression) when they are produced on the main silicon support.

It is also understood that the combination of two main silicon layers, each covered with a film of silicon nitride, according to FIG. 6, may also pose adherence or contact quality problems when the nitride films are facing each other. In particular, bubbles are likely to form at the interface between the silicon nitride layers, locally generating defects in the final structure.

For a better illustration of the aforementioned problems, reference may be made to documents (2), (3), (4), (5) and (6), the references of which are indicated at the end of the description and which relate to contact stresses between different layers.

Document (3) in particular, shows that it is possible to compensate the effects or stresses generated by a silicon oxide surface film formed at the surface of a silicon wafer, by covering this surface film with a second film of silicon nitride.

A substantially plane structure may be obtained.

The thickness of the second (nitride) film should be accurately controlled in order to finally obtain a structure with plane faces.

However, it is found that the generated stresses between the layers are not simply related to the materials brought into contact, as in the case for layers produced by successive depositions for example, but they are also related to the quality of the molecular adhesion between the layers.

Thus, subsequent treatments undergone by a structure according to document (3), or the combination of such a structure with other layers, may cause a change in the balance of stresses so that the final stresses of the structures are difficult to control.

DESCRIPTION OF THE INVENTION

An object of the present invention is to provide a method for producing a multilayer structure including at least one adhesion step, and providing accurate control of the stresses occurring in the structure after combining layers of different materials.

An object is in particular, to provide such a method for changing and adjusting the stresses in order to obtain a planar final structure or having a predetermined deflection.

An object is to be able to transfer, by utilizing the adhesion, at least a crystalline layer in order to obtain a structure with controlled stress.

An object is also to provide such a method for producing a structure free from contact defects at the interfaces between the layers of different materials.

Still another object is to provide a method able to take into account treatments prior or posterior to the production of the structure and which is compatible with the requirements of an industrial implementation such as for example an implantation treatment in order to obtain a separation.

To achieve these objects, the invention more specifically relates to a method for producing a multilayer structure comprising at least a first and second layers called main layers, connected with each other by a stack of at least two stress adaptation layers and having a determined structure stress, wherein:

a) the first main layer is provided with a first stress adaptation layer, and at least a second stress adaptation layer is provided on one of the second main layer and the first stress adaptation layer, b) an assembly of the first and second main layers is made via stress adaptation layers (said assembly advantageously comprising an adherence bond between layers), the first and second adaptation layers being produced in materials and with thicknesses such that at the end of the method, said determined structure stress is obtained in the structure.

For example, the first adaptation layer and the second adaptation layer are selected (type of realization, nature, thickness) such as, if they are on the first main layer and on the second main layer, respectively, independently (i.e. before assembly), they cause deformations in opposite directions. These deformations are not necessarily of the same amplitude.

In certain embodiments, at least one of the adaptation layers is surmounted with an intermediate layer in order to obtain the desired multilayer structure.

Advantageously, a heat treatment with sufficient temperature and duration in order to adjust said determined structure stress in the structure, may then be carried out, after step b).

According to a preferred embodiment, the adherence bond may be a molecular adherence type bond.

The invention may also use a bond selected from a braze, a weld, a bond by means of an adhesive substance, interdiffusion between layers or a combination of these different techniques. In these techniques, the bond is produced by means of a so-called bonding layer. This bonding layer is either between the adaptation layers or between one of the adaptation layers and the corresponding main layer.

The structure stress is understood as the stress resulting from the stresses of each of the adaptation layers, the stresses of each of the main layers and the stresses related to the bond interface.

The structure stress determines the deflection, either convex or concave, or the planarity of the surfaces of the obtained structure.

The heat treatment optionally carried out after step b) not only provides an enhancement of the quality of the bond, but especially, by adjusting the implemented heat expenditure, enables the contact stresses between the layers to be changed in order to adjust the tensile and compression stress balance.

The implemented heat expenditure may be adjusted by notably taking into account the heat expenditures of treatments prior or posterior to step c). Thus, other heat treatments performed on the structure are not detrimental to obtaining a given stress.

The heat treatment expenditure is also adjusted according to other parameters controlling the stresses in the layers.

Among these parameters, let us mention:
the implemented materials and the treatments undergone by these materials,
the thickness of the layers and their embodiments,
the roughness condition of the surface and the shape of the layers brought into contact,
the quality of the cleaning of the surfaces and their more or less hydrophilicity.

By taking into account these parameters for selecting the heat expenditure, it is possible to adapt the internal stress of the final structure and therefore its deformation. In particular, stresses in the stress adaptation layers may be increased, decreased or even reversed.

According to a first possibility of implementation of the invention, in step a), the first stress adaptation layer may be formed on the first main layer and the second stress adaptation layer formed on the second main layer. In this case, in step b), a bond is produced between the adaptation layers.

As the contact stresses of the stress adaptation layers with the main layers are of opposite sign, one of the stress adaptation layers has a convex surface and the second adaptation layer has a concave surface.

The surfaces to be assembled thus have, to a certain extent, a shape complementarity which provides a quality contact free from bond defects such as recesses or poorly adhered areas.

According to an alternative, both stress adaptation layers may be formed on the first main layer and the bonding may occur between the second main layer and the surface stress adaptation layer, securely fixed to the first main layer.

According to another aspect of the invention, before step b), a preparation of the layers which are to be associated through a molecular bond may be performed in order to adjust a surface condition of these layers and to impart hydrophilicity to them, for example.

The adjustment of the condition of the surface may either consist of a smoothing process (chemical, mechanochemical process or by a heat treatment) or, on the contrary, of an operation tending to further roughen the surface of at least one of the layers to be assembled.

By changing the amplitude of the roughness of the faces to be assembled, it is possible to control the adhesion energy between the layers and therefore the resulting stresses.

According to an alternative, the method may include a thinning step of one of the main layers after assembly.

It is advantageous to obtain a thin layer, in particular on a thin silicon layer, above the stress adaptation layers one of which is at least an insulator, for example for the subsequent production of integrated electronic circuits (the SOI substrate for example).

The thinning of one of the main layers may be performed by a mechanical or mechano-chemical abrasive treatment.

Thinning may also be performed by fracture. In this case, the method includes at least an ion implantation of gas species in at least one of the main layers or adaptation layers in order to form a fracture area, and the thinning step includes a separation step for said implanted layer according to the fracture area, for example with a thermal and/or mechanical treatment. The stress of the structure will then be changed by the thinning step. In addition, the stress during the course of the method may advantageously be utilized as a determined "intermediate" structure stress, in order to participate in this thinning. The final structure obtained after thinning, i.e. after separating one of the layers, has a new determined "final" structure stress. The structure according to the invention, in certain alternatives, may contain a certain number of layers, certain of which may be thinned, or even suppressed, their role being justified in certain cases, only for adapting the intermediate stress which participates in the thinning. The adaptation of the intermediate stress may be an object per se. By using an intermediate stress which participates in the separation, the dose of the implanted species (hydrogen and/or rare gases), and/or the heat expenditure and/or the work induced by the mechanical force(s) applied for the separation, may be reduced. For example, it is possible to obtain separation with very low heat expenditure on structures where the main layers have different thermal expansion coefficients. By controlling the intermediate stress, the method may be considerably enhanced by changing either the implantation conditions or the separation conditions.

The making of a fracture area in a layer by implantation of a gas species may be performed according to known techniques per se.

For example, one of the techniques uses an implantation of a gas species able to generate an embrittled layer formed of microcavities or gas microbubbles.

A "microcavity or gas microbubble" means any cavity generated by implantation of hydrogen gas and/or rare gas ions in the material. The cavities may assume a very flat shape, i.e. with a low height, for example of a few interatomic distances as well as a spherical shape or any other shape different from both of these previous shapes. These cavities may contain a free gas phase and/or gas atoms derived from the implanted ions fixed on the atoms of the material forming the walls of the cavities; these cavities may even be empty.

These cavities are generally called "platelets" "microblisters" or even "bubbles".

Gas species mean elements, for example hydrogen or rare gases in their atomic form (for example H), or in their molecular form (for example $H_2$) or in their ion form (for example $H^+$, $H_2^+$) or in their isotope form (for example deuterium) or isotope and ion form.

Moreover, ion implantation is understood as any kind of means for introducing the previously defined species, either alone or combined, such as ion bombardment, diffusion, etc.

The fracture heat treatment is performed with a thermal expenditure which depends on the thermal expenditure supplied to the main layer during the implantation, and during the steps which took place before the fracture. According to the case, this thermal treatment may be zero in time and/or in temperature. Further, this heat treatment may be adjusted according to other exerted stresses, such as for example, mechanical, tensile, shear, bending forces, etc., either exerted alone or combined.

The heat treatment, regardless of the type of solid material, leads to the coalescence of the microcavities which brings about an embrittlement of the structure at the microcavity layer. This embrittlement enables the material to be separated under the effect of internal and/or pressure stresses in the microcavities, this separation may be natural or assisted by applying external stresses.

Mechanical forces may be applied perpendicularly to the planes of the layers and/or parallel to the latter. They may be localized at a point or an area, or be applied at different locations in a symmetrical or dissymmetrical way.

In addition, if the intention is to adapt the final structure stress, the heat expenditure for the fracture is taken into account for establishing the heat expenditure of the adaptation step. The adaptation step for the stresses of the final structure may also include a thinning step, for example by sacrificial oxidation and/or chemical etching and/or plasma etching and/or polishing.

Several possibilities may be contemplated for producing the stress adaptation layers.

According to a first possibility, at least one of the stress adaptation layers may be formed by depositing material according to a deposition method selected for example from spray, epitaxy, chemical deposition such as chemical phase deposition, low pressure vapor deposition, and plasma-aided chemical vapor deposition methods.

According to an alternative, a stress adaptation layer may also be obtained by a surface oxidation of one of the main layers.

In particular, when one of the main layers is a silicon layer, one of the adaptation layers, may be a thermal oxide layer of $SiO_2$.

According to a third possibility, at least one stress adaptation layer may be obtained by implanting species in a main layer. By implanting species in one of the main layers, an area with changed properties may be formed at the surface of this layer.

In particular, by implanting species, stresses may be generated and the density of the material may be changed locally. The depth at which is located the majority of the implanted species, depends on the implantation conditions, for example, on its energy, if the implantation is of the ion implantation type. The film of implanted species, defined by this depth, and its neighborhood, where the majority of the implanted species is localized, then forms one of the layers of the stress bilayer. The film between this film of implanted species and the surface of the second main layer may form one of the two films of the stress bilayer.

The stress intensity may be adapted depending on the nature of the species, on the dose or on various implantation parameters (temperature, implantation current, energy, . . . ). In particular, the implantation may be performed with gas species, for example hydrogen and/or rare gases.

The presence of a stress in the structure participates in the separation and enables the dose of implanted species (hydrogen and/or rare gases), and the heat expenditure and/or the work induced by the mechanical force(s) applied for separating it, to be reduced. Thus, the presence of this stress enables either the implantation conditions or the separation conditions to be changed. The method may be considerably enhanced by controlling the stress. For example, it provides fracture with very low heat expenditure on structures where the main layers have different thermal expansion coefficients. The implantation may also be performed before or after assembling the structure.

In certain cases where at least one of the adaptation layers is sufficiently thick and/or stiff, the normally adjacent main layer may be omitted or may coincide with this adaptation layer. After separation, a changed main layer and a multilayer stack are obtained, wherein the latter may be reused as a main layer comprising a stress adaptation layer.

The embodiment of the method described above, may be applied to main layers in miscellaneous materials. The main layers in identical or different materials may for example be in monocrystalline, polycrystalline or amorph materials and for example in silicon, germanium, silicon carbide, in type III–V or II–VI semiconductors such as GaAs, GaN, InP, . . . , in glass or quartz, in superconducting materials, in diamond, or in ceramic materials (such as $LiTaO_3$, $LiNbO_3$, . . . ).

Thus, the main layer may be formed by one or several layers for example adhered, coated or epitaxied layers.

The stress adaptation layers for example may be in a material selected from $SiO_2$, SiN, $Si_3N_4$, TiN, diamond and metals (such as Pd, alloys, . . . ) or in one of the materials which may form one of the main layers, or in a combination of such materials.

The invention also relates to a multilayer structure with controlled internal stresses comprising, in this order, a stack of a first main layer, of at least a first stress adaptation layer in contact with the first main layer, of at least a second stress adaptation layer in contact with said stress adaptation layer and a second main layer in contact with the second stress adaptation layer. In this structure, the first and second stress adaptation layers have contact stresses with the first and second main layers which are respectively with the opposite sign.

In a particular application, the structure may have a suspended membrane, the suspended membrane including at least a portion of one of the first and second main layers, released from the second main layer, from the first main layer, respectively.

The suspended membrane may support other functional layers. For example, it may further include at least one layer of supraconducting material covering said portion of one of the first and second main layers.

Other features and advantages of the present invention will become more apparent from the description which follows, with reference to the figures of the appended drawings. This description is given as a purely non-limiting illustration.

DETAILED DESCRIPTION OF THE EMBODIMENTS OF THE INVENTION

A first exemplary embodiment relates to the production of a stacked structure consisting of a very thin silicon film and a stress adaptation bilayer supported by a thick silicon substrate. The described embodiment requires a separation method for forming the thin surface layer of silicon.

Figure 7:
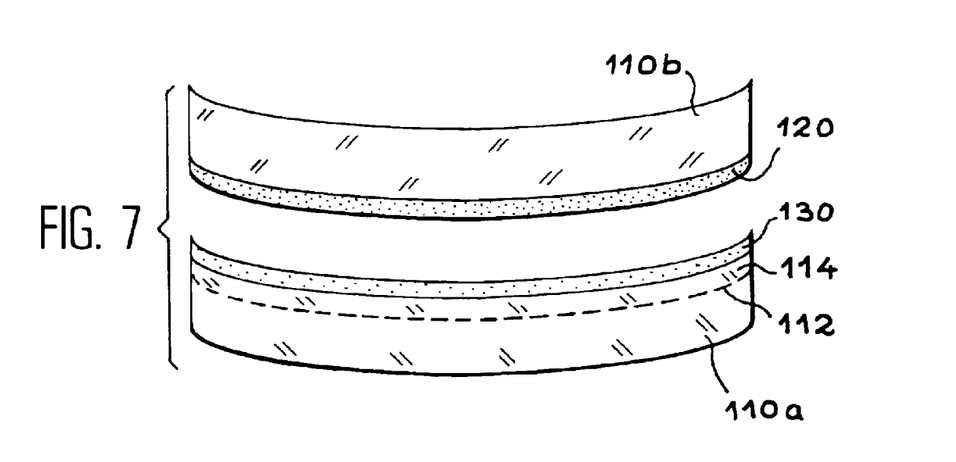
FIGS. 7, 8 and 9 are schematic sectional views showing the steps for manufacturing a multilayer structure according to a particular implementation of the method of the invention.

In a first step illustrated by FIG. 7, a silicon nitride $Si_3N_4$ film 130, with a thickness of 400 nm, is formed according to a low pressure chemical vapor deposition (LPCVD) method, on a silicon plate which forms a first main layer 110a. The low pressure vapor deposition enables a film to be produced which induces a low deflection on the main layer. This is notably the case if the deposition is performed on both faces of this layer.

The silicon nitride film 130 forms a first stress adaptation layer.

According to an alternative embodiment of the invention, this adaptation layer may be surmounted with an intermediate layer made for example with a silicon oxide film and a silicon oxinitride film, for example with a thickness of a few nm. In this case, this intermediate layer either enables the molecular adherence bond used for the assembly to be enhanced or provides improvement of the electrical quality of the interface with the main layer.

Optionally, the silicon plate is first covered with a very fine silicon oxide layer, not shown, for example with a thickness of 10 nm. The importance of such a very thin layer is that for example it forms an interface with a very good electronic quality, with a silicon surface layer as described hereafter.

After forming the nitride film 130, hydrogen implantation is carried out through the film 130 with an implantation dose of the order of $2.5 \cdot 10^{16}$ atoms/cm$^2$. The implantation leads to the formation of a fracture area marked with reference number 112. The hydrogen implantation parameters may be changed when the deflection of the nitride film is changed, according to deposition conditions, for example.

On a second silicon plate 110b, also illustrated in FIG. 7, a silicon oxide film 120 is produced by a heat treatment under an oxidizing atmosphere. The thickness of the oxide film is substantially equivalent to that of the nitride film 130.

The second silicon plate 110b and the oxide film 120 form a second main layer and a second stress layer, respectively.

The silicon nitride layers and the initially formed silicon oxide on the main silicon layers, generate contact stresses with the opposite sign. This, is expressed by deformations of the main layers such that the surfaces of the nitride and oxide stress adaptation layers are concave and convex, respectively.

The method is continued with a step for cleaning the plates for imparting hydrophilicity to the surface of the stress adaptation layers 120, 130. With the cleaning, a controlled surface micro-roughness may be obtained, with an RMS value typically less than 0.7 nm, which is compatible with a direct molecular adhesion. The micro-roughness may be measured and examined by an atomic force microscope in a spatial frequency range from $10^{-2}$ $\mu m^{-1}$ to $10^3$ $\mu m^{-1}$. The examination of the surface roughness, by the step for cleaning the plate before bonding them, is presented here as an advantage over the surface polishing techniques, for a silicon nitride film, the thickness of which may attain at least several tenths of a micron.

With the cleaning step, a change in the bonding energy may be induced and so a change in the specific stress of the bilayer subsequently formed by bonding the stress adaptation layers.

In addition, as with the cleaning step, a mechanochemical polishing step may be suppressed in the method, good thickness homogeneity of the films of the stacked structure, formed in a subsequent step, is also provided.

The next step of the method actually consists of bringing the stress adaptation layers into direct contact in order to cause their bonding. This operation takes place at room temperature.

In view of FIG. 7, it is understood that, with the complementarity of the deformation of the layers the risk of a poor contact may be minimized.

After the bonding process, a first heat treatment performed for 30 minutes at a temperature of 500° C. is able to cause a fracture in the fracture area 112 shown in FIG. 7, and therefore remove a thin surface layer 114 from the first main layer 110a,. This surface layer remains secured to the second main layer 110b via the bilayer formed by the stress adaptation layers 120, 130 optionally combined with intermediate layers. The heat treatment may totally or partly be assisted by applying mechanical stresses. Accordingly, the heat expenditure required for the fracture may be reduced. It may be zero in time and in temperature.

Figure 8:
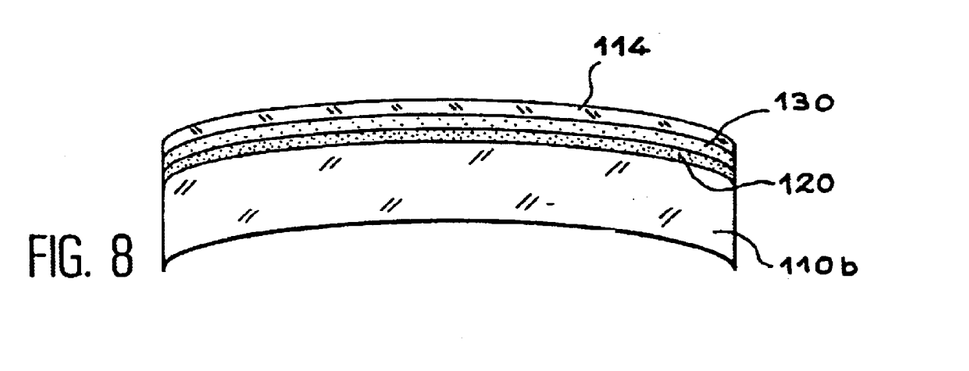
Figure 9:
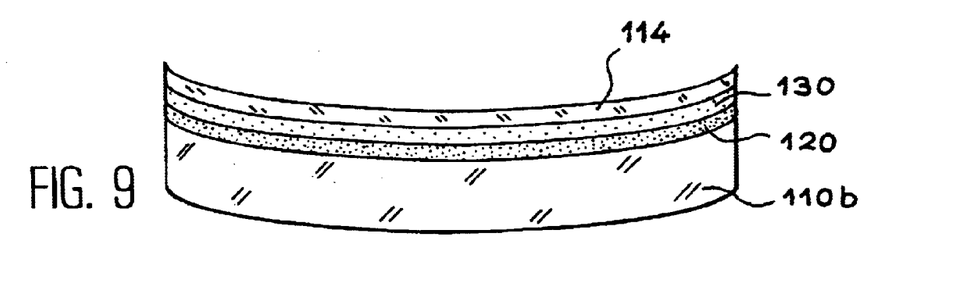

The obtained structure is illustrated by FIGS. 8 and 9.

The thickness of the thin surface layer of silicon 114 is of the order of a few tenths of micrometers. It is set by the penetration depth of the gas species from the separation layer (fracture), implanted in the first main layer of silicon. As the implantation occurs through the silicon nitride film 130, the implantation depth and therefore the thickness of the thin layer 114 of silicon also depend on the thickness of the silicon nitride film 130.

By the fact that the first main layer 110a is provided with a stress adaptation layer, it is possible to reduce the implantation dose required for the fracture in the area 112 and/or the heat expenditure for the first heat treatment for fracture and/or the mechanical forces for separation. The specific stresses induced by the stress adaptation layers and notably the silicon nitride layer 130, in the first main silicon layer 110a actually promote fracture.

For example, it is possible to obtain a gain in temperature, in energy and finally in cost.

As a comparison, in the same implantation conditions (energy, current, temperature, . . . ) and transfer heat treatment conditions, the minimum dose for obtaining separation is $3.5 \cdot 10^{16}$ atoms/cm$^2$, for a conventional stacked structure where the nitride film is replaced with a thermal oxide film with a thickness of 400 nm.

In a following step, a second heat treatment is carried out. This treatment has a double purpose of providing more intimate bonds at the interface between both stress adaptation layers brought into contact beforehand, and of changing or adjusting the stresses induced within the finally obtained structure.

By adapting the thicknesses of the stack layers, their surface condition before their bringing into contact and especially the heat expenditure of the second treatment, it is possible to control the stresses generated by the bilayer 120, 130 and therefore control the convex or concave deformation of the final structure (FIGS. 8 and 9).

As an example, within the scope of application to a membrane device, it may be advantageous to produce a stacked structure with a concave shape, so that, after partially releasing the membrane, a pre-tensioned membrane may be obtained.

According to the implemented heat expenditure, a positive, negative or zero deflection may be obtained.

Of course, the second heat treatment takes into account the heat expenditure of the first heat treatment and optionally the use of mechanical stresses.

As an example, the second heat treatment may be carried out at a temperature of 1 100° C. for 2 hours. For oxide and nitride films with the same thickness, of the order of 400 nm, a concavity of the structure is obtained with a deflection of about 50 µm.

The deflection of the final stacked structure mainly depends on two parameters which are the ratio Re of thicknesses $E_{nit}$ and $E_{ox}$ of the nitride 120 and silicon oxide 130 stress adaptation layers and the heat expenditure applied to the structure. The effect of the thickness ratio of the layers, at the set sealing temperature, expresses the fact that the deflection of the structure is proportional to the effective stress and to the thickness of the adaptation layers.

It further appears in an original way that when the temperature $T_c$ of the second implemented heat treatment varies, the effective stress on the bilayer is changed. The effect of the applied heat treatments particularly depends on the condition of the adhesion interface (micro-roughness, bond density between the layers, . . . ). As an example, for a ratio of Re=1, a temperature increase of $\Delta T_c$=100° C. causes a stress increase $\Delta\sigma/\sigma$ in the bilayer such that $\Delta\sigma/\sigma$=100%.

Figure 10:
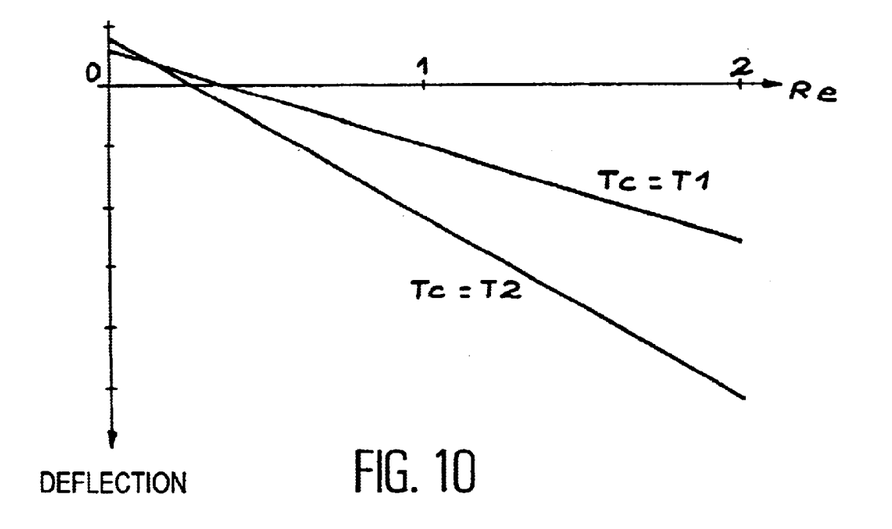
FIG. 10, is a graph showing, with an arbitrary scale, the deflection values for the structure obtained by the method, versus the heat treatment parameters.

FIG. 10 is a graph which shows in arbitrary units, the deflection of the finally obtained structures versus the thickness ratio of the stress adaptation layers (Re=$E_{nitride}/E_{oxide}$) and for two different treatment temperatures $T_1$ and $T_2$ such that $T_2>T_1$.

In a second exemplary embodiment of the method, described hereafter with reference to FIGS. 11–15, the stress adaptation bilayer consists of a $SiO_2$ film and of an implanted layer in one of the main layers.

Figure 11:
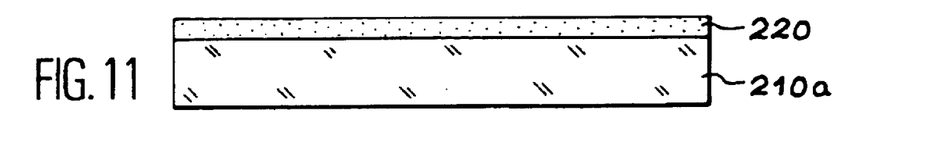
FIGS. 11–15, are schematic sectional views showing the successive steps of another implementation possibility for the method of the invention.

As shown in FIG. 11, a first stress adaptation layer 220 is formed by implanting species in a silicon wafer. The portion of this wafer which is not affected by the implantation forms the first main layer 210a.

As an example, the implantation may occur with nitrogen, with a dose of $10^{16}$ atoms/cm$^2$ and with an energy of 135 keV.

With such an implantation, the stress adaptation layer 220, i.e. the area disturbed by the implantation, induces a compression stress of a few tens of MPa. For the sake of simplification, the deformations of the layers induced by the stresses are no longer illustrated in FIGS. 11–15.

Figure 12:
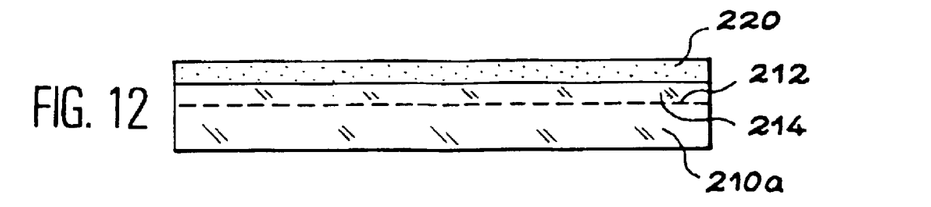

A second deeper implantation, illustrated in FIG. 12, is then carried out with gas species. This implantation occurs through the stress adaptation layer 220 in order to form a separation (fracture) layer 212.

As an example, a hydrogen dose of the order of $5.10^{16}$ atoms/cm$^2$ may be implanted.

The energy, and so the implantation depth enables a more or less thick, thin surface layer 214 to be defined in the main layer 210a. The latter is delimited by the separation layer 212.

Figure 13:
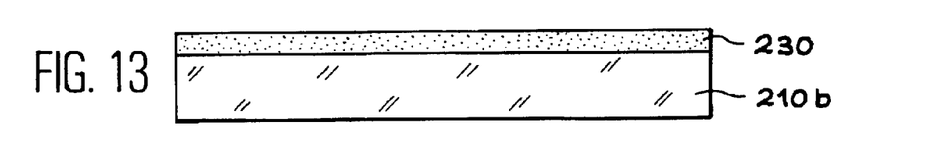

Moreover, as shown in FIG. 13, a silicon oxide ($SiO_2$) film 230, with a thickness of the order of 200 nm is formed at the surface of another silicon wafer which forms the second main layer 210b. The silicon oxide film 230 forms a stress adaptation layer.

The main layers provided with the stress adaptation layers, are then cleaned so that the micro-roughness and the hydrophilicity of the stress adaptation layers provide molecular adhesion as soon as these layers are brought into contact with each other.

Figure 14:
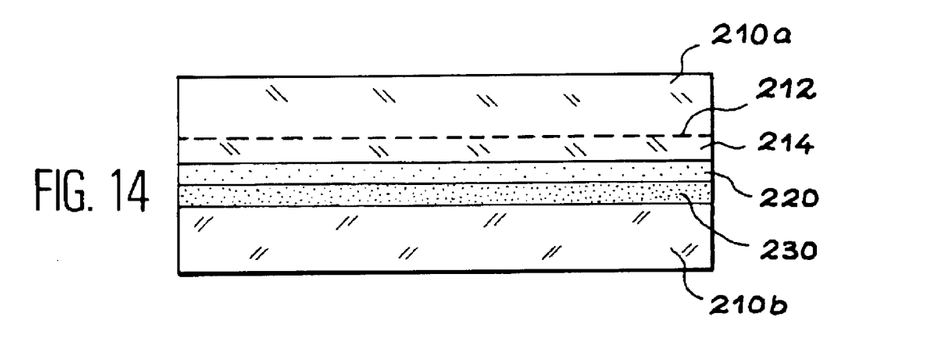

The assembly of the main layers by bringing the stress adaptation layers into contact, is illustrated in FIG. 14.

By bringing the silicon oxide layer 230 into contact with the implanted layer 220, a stress adaptation layer may also be formed.

In certain cases, where at least one of the adaptation layers is sufficiently thick and/or stiff, the normally adjacent main layer may be omitted or may coincide with this adaptation layer.

Figure 15:
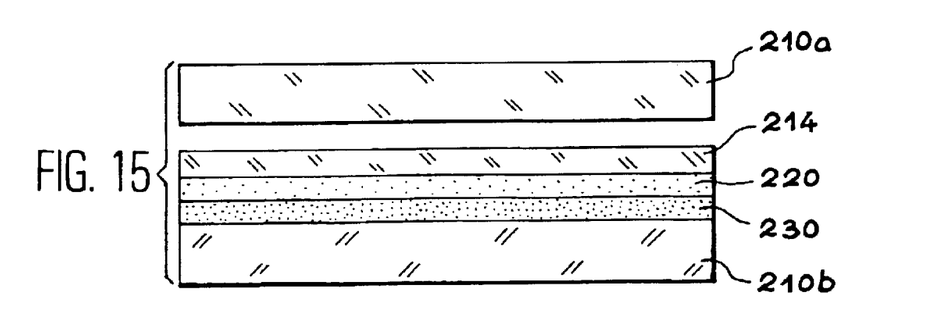

A first heat treatment, a so-called transfer treatment (which optionally enables the adhesion to be reinforced between the stress adaptation layers) is performed with sufficient heat expenditure in order to provide a fracture along the fracture layer. This heat treatment may be applied, for example in a continuous, variable or pulsed way for example. This transfer heat treatment may optionally be assisted by applying mechanical forces for example by traction and/or shear and/or bending. According to the applied stresses, the heat expenditure may be performed with reduced temperature and times, or even zero times. The fracture provides separation of the thin layer 214 and the first main layer 210a, as shown in FIG. 15. With these stresses generated by the stress adaptation bilayer, it is also possible to reduce the dose of the implanted species and to reduce the heat expenditure for the transfer treatment and/or the mechanical forces for separation.

For example, separation (fracture) may be caused by heating the structure to 450° C. for 30 minutes. As a comparison, for causing a separation in a substrate comparable to that of FIG. 12, in the absence of stress adaptation layers, a treatment at a temperature of at least 500° C. would be required for 30 minutes in order to obtain a separation.

Finally, a final heat treatment is performed. In the stacked structure, each of the stress adaptation layers of the bilayer is submitted to an effective stress, the resulting stress of which may be changed overall by the adhesion mechanisms of both plates and by the various applied heat treatments. The final stacked structure is then submitted to a stress which may in particular be adapted by the final heat treatment.

The various heat treatments may advantageously be mechanically assisted (for example by traction, compression, shear, bending or by applying electrostatic or magnetic fields according to the nature of the layers) in order to induce a further stress effect in the specific bilayer.

According to a third example, an alternative embodiment not shown in the figures, consists in not proceeding with the thinning of one of the main layers by transfer fracture of the layers. As the other preparation steps are comparable to those described in the second exemplary embodiment, the thinning of one of the main layers, if desired, may be performed either through simple mechanical and/or chemical abrasion.

According to another embodiment for applying the invention, it is possible to produce in the surface layer, obtained after thinning, and in the whole or part of the adaptation layers and intermediate layers of the final structure, components such as membranes, wherein the effective stress is controlled upon producing the stacked structure. The advantage of such an approach, is that the surface of the surface layer is available for example for performing an epitaxy thereon without having to deposit stress adaptation layers thereon for the membranes, during their elaboration.

As an example of application of this other embodiment, let us mention the epitaxy of a supraconductor of the YBaCuO type on a surface layer of silicon in order to produce a membrane bolometer. This epitaxy usually assumes, advantageously, the use of epitaxy adaptation layers so-called "buffer" and "seed layers". They have the purpose of adapting the crystal lattice parameter between the supraconductor and silicon. These layers may be in MgO, $CeO_2$, $ZrO_2$, for example, for the case of YBaCuO deposited on silicon.

The surface layer of silicon is that obtained by the method described beforehand, i.e. by hydrogen implantation and separation, and the stress of the stacked structure, comprising the stress adaptation bilayer, obtained at the end of the method for elaborating such a silicon layer, is therefore primordial for the quality of the successive epitaxy or epitaxies insofar that a pre-stressed support is made available, which is better adapted to these epitaxies.

In addition, it is then advantageous to be able to produce membranes, for example by etching, before depositing the supraconductor by epitaxy.

Although the preceding description relates to bulk silicon main layers, it is understood that the main layers may themselves have a multilayer structure with a plurality of sublayers.

Moreover, when a silicon oxide adaptation layer is available, the latter may be formed by a thermal or deposited native oxide.

In addition the main layers may include electronic, mechanical or optical components formed prior or a posteriori to the described treatments.

A particular example of application of the invention is now described with reference to FIGS. 16–20 which illustrates as a sectional view, different steps and possibilities for producing a suspended membrane structure.

Figure 16:
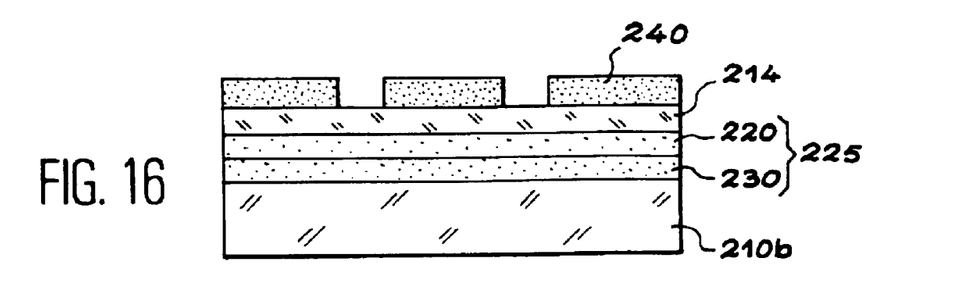
FIGS. 16–18, are schematic sectional views, showing the successive steps for producing a structure with a suspended membrane and illustrating a particular application of the invention.

FIG. 16 shows a multilayer structure comparable to the one in FIG. 15, after thinning or fracture of the first main layer.

While using the same reference numbers for portions identical or similar to those of FIG. 15, the structure of FIG. 16 includes a thin layer 214 of silicon, derived from the first main layer, a pair of stress adaptation layers 220, 230 and a second main layer 210b, also in silicon, which here forms a supporting substrate.

For the sake of simplification, the pair of stress adaptation layers or bilayer, is referred in the following text with a unique reference number 225.

The thin layer 214 is covered with an etching mask 240 having a pattern matching the contours of a membrane to be desirably produced in the structure. More specifically, the mask has apertures which expose the areas of the structure to be etched in order to define the shape of the suspended membrane.

The mask 240 for example is a mask of photoresist, shaped by insolation through an insolation mask, then through development.

Figure 17:
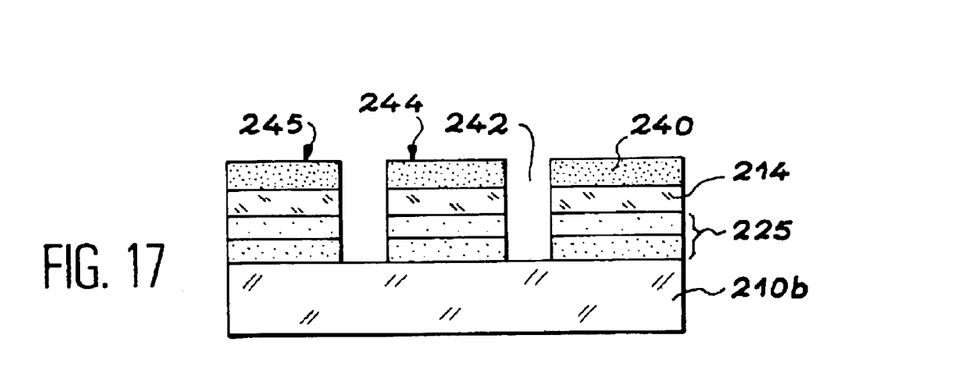

A first anisotropic etching through the apertures of the mask 240 enables cuts to be formed 242 which extend through the thin layer 214 and the whole or a portion of the stress adaptation bilayer 225. The etching may also be stopped on the second main layer. The stopping of the etching process may be facilitated by an etching stop layer, not shown, placed on the second main layer before forming the multilayer structure.

The cuts delimit a central portion 244 for subsequently forming the suspended membrane. However, it should be stated that the cuts do not totally surround the central portion 244 but retain "bridges" which connect it to the structure 245 surrounding the central portion. These "bridges" which are not visible because of their being outside the sectional plane of the figures, may optionally form in the final structure, small beams for supporting the suspended membrane, thus providing electrical and/or thermal conduction, for example.

Figure 18:
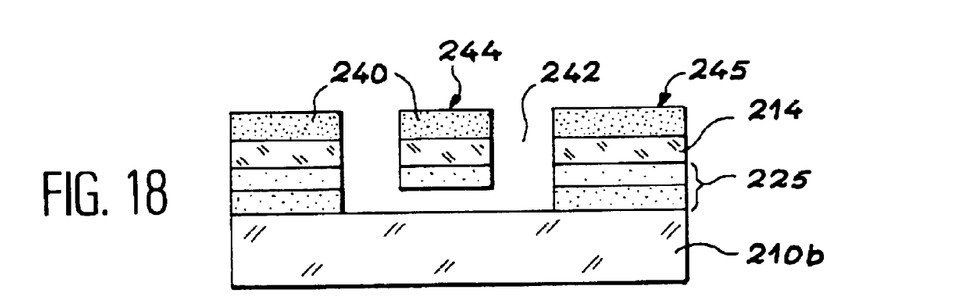

A next step illustrated in FIG. 18, comprises selective anisotropic etching for eliminating at least a portion of the stress adaptation bilayer in order to release a portion of the thin layer, in this case, the central portion 244 which forms a suspended membrane from now on.

For the sake of simplification, the figure does not take into account any optional etching of the side flanks of the bilayer 225 in the cuts, during the anisotropic etching.

Figure 19:
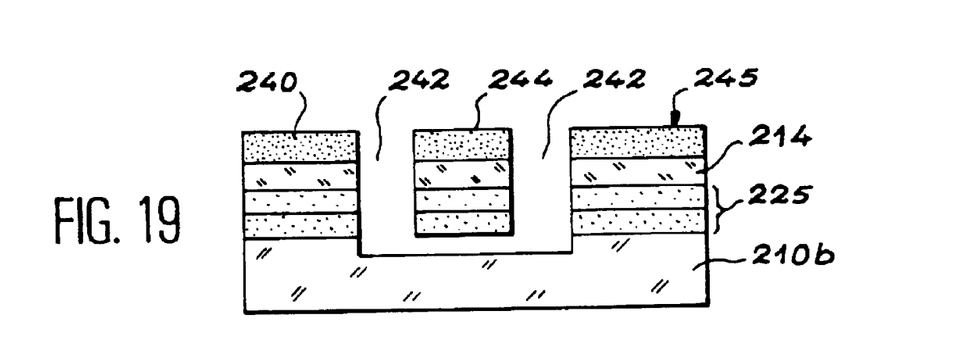
FIG. 19, is a schematic sectional view of a structure forming an alternative of the structure or FIG. 18.

FIG. 19 illustrates an alternative wherein the membrane is released by means of anisotropic etching which provides selective etching of the second main layer 210b, i.e. the supporting substrate.

The membrane may also be released by combined etching of the second main layer and of the stress adaptation bilayer.

Finally, upon completing the etchings, the resist layer forming the mask 240 may be removed.

Figure 20:
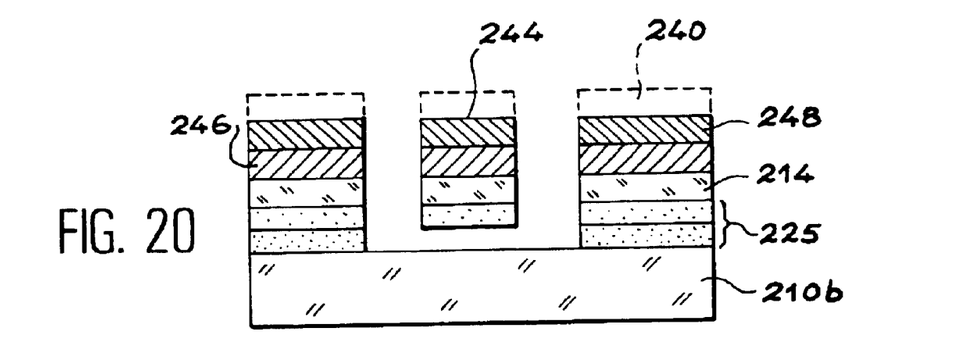
FIG. 20, is a schematic sectional view of a structure forming another alternative of the structure of FIG. 18.

FIG. 20 shows a particular embodiment, comparable to that of FIG. 18, wherein the additional layers were formed on the thin layer 214 before the etching.

For example, the additional layers include a seed layer 246 and/or a buffer layer and a supraconducting material layer 248 for example of the YBaCuO type.

The seed layer 246 and/or a buffer layer not shown, are for promoting the growth of the supraconducting material on the thin layer of silicon and/or for correcting a possible mismatch of the crystalline lattice between the silicon of the thin layer and the supraconductor. These layers are etched as already described with reference to FIGS. 8 or 9 in order to obtain the final structure of FIG. 20 with a suspended membrane 244.

The position of the etching mask 240, removed, is shown in broken lines.

A possible application of a suspended membrane structure such as the one described, is the production of bolometer type devices, for example.

Cited Documents (1) Bower et al., Appli. Phys. Lett. 62, 26, 1993, p. 3485.
(2) M. Tamura et al., Jpa. J. Appl. Phys., vol. 11, No.8, August 1972, p. 1097
(3) H. Mikoshiba, J. Electrochem. Soc., vol. 123, No.10, October 1976, p. 1539.
(4) S. Sanchez et al., J. Michromech. Microeng. 7 (1997), p.111–113.
(5) Harendt et al., Sensors and Actuators A, 25–27 (1991), p. 87–92.
(6) 
  C. Gui, M. Elwenspoek, J. G. E. Gardeneiers, P. V. Lambeck, E.C.S. vol. 97-36, 1997, p. 114.
(7) FR-A-2 681 472.

What is claimed is:

1. Method for producing a multilayer structure having a defined geometrical orientation from at least a first main layer and a second main layer comprising the steps of:

(a) providing the first main layer with a first stress adaptation layer and providing at least a second stress adaptation layer between the first stress adaptation layer and the second main layer;

(b) wherein said first and second main layer is assembled via the stress adaptation layers such that stress is exerted on said main layers to cause the multilayer structure to assume a predetermined geometrical orientation selecting from the group consisting of: convex, flat or concave geometry based upon the thickness, number and adherence of the adaptation layers.

2. The method according to claim 1, further comprising the step of forming an adherence bond between said first and second main layer.

3. The method according to claim 1, wherein the fist adaptation layer is formed from a main layer and the second adaptation layer is formed from a main layer or from the first adaptation layer with each adaptation layer having a thickness to cause stress in the first and second main layers resulting in deformation in opposite directions, respectively.

4. The method according to claim 1, further comprising forming molecular bonding between layers.

5. The method according to claim 4, wherein said molecular bonding is performed for adjusting the surface condition of the molecular layers.

6. The method according to claim 4, wherein during step b), the molecular bonding is performed at room temperature.

7. The method according to claim 2, wherein said adherence bond is formed using a bonding technique selected from the group consisting of: brazing, welding, interdiffusion between layers, and bonding with an adhesive substance.

8. The method according to claim 1, further comprising interposing an additional adhesion layer between said main layers.

9. The method according to claim 1, wherein during step a), the fist stress adaptation layer (130, 220) is formed on the first main layer (110a, 210a) and the second stress adaptation layer (120, 230) is formed on the second main layer (110b, 210b), and wherein during step b), molecular bonding is performed between the stress adaptation layers.

10. The method according to claim 1, wherein the first and second stress adaptation layers are formed on the first main layer and wherein the second main layer is boned to one of the first and second stress adaptation layers.

11. The method according to claim 1, further comprising the step of treating at least one of the main layers after assembly to cause thinning.

12. The method according to claim 11, wherein said thinning of a main layer is formed from fracturing of said layer to form a fracture area.

13. The method according to claim 12, further comprising the step of implanting a gas species in at least one of the first or second main layers to induce a fracture area (112, 212) therein, and wherein the treating step is a thermal and/or mechanical treatment.

14. The method according to claim 1, wherein at least one stress adaptation layer is formed by a method selected from the group consisting of: spry, epitaxy, chemical deposition, chemical vapor deposition, low pressure vapor deposition and plasma vapor deposition.

15. The method according to claim 1, wherein at least one stress adaptation layer is obtained by surface oxidization of a main layer.

16. The method according to claim 1, wherein at least one stress adaptation layer is obtained by implanting species in a main layer.

17. The method according to claim 1, wherein the main layers are composed of at least one material selected from silicon, germanium, silicon carbide, III–V type semiconductors, II–VI semiconductors, glass, superconductors, diamond, ceramic materials ($LiNbO_3$, $LiTaO_3$), and quartz.

* * * * *